United States Patent [19]

Ginthner et al.

[11] Patent Number: 4,998,108
[45] Date of Patent: Mar. 5, 1991

[54] LARGE RANGE, HIGH SPEED, HIGH ACCURACY DIGITAL-TO-ANALOG CONVERTER

[75] Inventors: James M. Ginthner, Wappingers Falls; Cecil T. Ho, Poughkeepsie, both of N.Y.

[73] Assignee: International Business Machines Corporation, Armonk, N.Y.

[21] Appl. No.: 559,488

[22] Filed: Jul. 30, 1990

[51] Int. Cl.[5] .......................................... H03M 1/66
[52] U.S. Cl. .................................. 341/145; 341/142
[58] Field of Search .............. 341/145, 142, 118, 131, 341/144

[56] References Cited

U.S. PATENT DOCUMENTS

| | | | |
|---|---|---|---|
| 3,689,924 | 9/1972 | Butler | 340/347 DA |
| 3,967,272 | 6/1976 | Sandford, Jr. | 340/347 DA |
| 3,984,830 | 10/1976 | Buchanan et al. | 340/347 DA |
| 3,995,266 | 11/1976 | Muller et al. | 340/347 DA |
| 4,016,555 | 4/1977 | Tyrrel | 340/347 DA |
| 4,137,525 | 1/1979 | Tyrrel | 340/347 AD |
| 4,410,879 | 10/1983 | Gumm et al. | 340/347 DA |
| 4,430,642 | 2/1984 | Weigand et al. | 340/347 DA |
| 4,450,433 | 5/1984 | Moriyama | 340/347 DA |
| 4,503,421 | 3/1985 | Hareyama et al. | 340/347 DA |
| 4,544,911 | 10/1985 | Altman et al. | 340/347 DA |
| 4,573,005 | 2/1986 | van de Plassche | 323/315 |
| 4,583,077 | 4/1986 | Yasuda et al. | 340/347 DA |
| 4,584,568 | 4/1986 | Zomorrodi | 340/347 DA |
| 4,611,195 | 9/1986 | Shosaku | 340/347 DA |
| 4,868,571 | 9/1989 | Inamasu | 341/145 X |

Primary Examiner—William M. Shoop, Jr.
Assistant Examiner—Sharon D. Logan
Attorney, Agent, or Firm—James R. Warnot, Jr.

[57] ABSTRACT

A digital-to-analog converter system includes a logic system which receives input signals, receives an increment/decrement signal, and provides a digital word composed of most significant bits and least significant bits. The system includes two DACs haaving separate data rates and ranges for converting the most significant bits and the least significant bits, respectively, the data rate of the second DAC being greater than the data rate of the first DAC. Combining circuitry produces an analog signal representative of the digital word from the first and second analog outputs. The data rate of the combined output may be as fast as the data rate of the second DAC, and the range of the combined output may be as large as the range of the first DAC. The system also includes track and hold circuitry which holds the value of the output of the first DAC until glitches are settled.

38 Claims, 2 Drawing Sheets

LARGE RANGE, HIGH SPEED, HIGH ACCURACY DIGITAL-TO-ANALOG CONVERTER

Technical Field

The present invention relates generally to digital-to-analog converters for use in control applications. More particularly, this invention relates to a digital-to-analog converter system which has a large range, high degree of accuracy, and high processing speed.

BACKGROUND OF THE INVENTION

In many control applications, it is necessary to convert a digital signal, such as the output of a computer or sensor, to an analog equivalent, in order to effect control. The analog signal is typically a voltage which corresponds to the value of the digital word. In many such applications, the size of the digital words required is greater than the range available in high accuracy, commercially available digital-to-analog converters (DACs). The cost of DACs dramatically increases as the range increases from 12 to 16 and even 18 and 22 bit performance. Additionally, converters of this range do not typically have high accuracy and high speed. The speed at which a DAC converts digital words to analog signals is also known as its data rate or bit rate and these terms are hereinafter used interchangeably. The data rates are limited because errors in the DAC analog signal occur when switching from one digital word to another. The time within which these errors settle is a primary factor which determines the DAC data rate. Several schemes have attempted to address the cost and performance problems by combining at least two digital-to-analog converters, one to process the most significant bits of the digital word and one to process the least significant bits. For example, in a 16-bit DAC application, one DAC might process bits corresponding to the range $2^0$ to $2^7$ while a second DAC might process bits corresponding to the range $2^8$ to $2^{16}$. The voltages representing these converted bits are then combined using appropriate voltage dividers, such as resistor networks, to properly weigh the contribution of each set of bits to the overall analog value. This combined voltage corresponds to the value of the digital word.

In Gumm, U.S. Pat. No. 4,410,879, two limited resolution DACs are cascaded in such a manner that one converts the lower order bits of a digital input signal and the other converts the higher order bits. A successive approximation technique is used to reset the lower order DAC. The apparatus of Gumm provides a higher range than would the use of a single DAC, but it does not provide greater accuracy or a higher data rate than would using each of the DACs individually.

Altman, U.S. Pat. No. 4,544,911, combines two DACs to provide a large range with a high degree of monotonicity, high resolution, and many steps. An output error results when the higher order DAC is switched up and the lower order DAC is switched down, due to the lower order DAC range being purposefully adjusted by a resistor divider to be greater than a single higher order DAC step. Such output errors due to switching are known as glitches. This glitch is corrected by rapidly cycling the lower order DAC so that the combined output of the two DACs is equal to the pre-switching output and smoothing the glitch with a low-pass filter. Altman provides a high range with many increments but does not provide a higher degree of accuracy than would the use of individual DACs. Altman also does not provide an operating speed which is greater than that provided by the use of individual DACs.

Hareyama, U.S. Pat. No. 4,503,421, discloses breaking an input digital signal into blocks of significant bits from the most significant bits to the least significant bits. The conversions from digital to analog are performed on each of those blocks before summing the analog signals. Hareyama provides an internal correction to increase the accuracy of the overall conversion process but does not use individual DAC components having differing accuracies and data rates.

Sandford, U.S. Pat. No. 3,967,272, breaks an input digital word into blocks composed of most significant bits and least significant bits and then successively performs digital-to-analog conversions of those blocks with a single DAC. In doing so, Sandford saves at least one converter chip at the sacrifice of system speed.

Van de Plassche, U.S. Pat. No. 4,573,005, discloses a DAC in which the input digital signal is broken into blocks, each block converted and the analog signals resulting from the individual conversions having an error-correction scheme applied to them prior to summation.

In Weigand, U.S. Pat. No. 4,430,642, an apparatus is disclosed in which a number of identical DACs are operated such that the ultimate analog output of the coupled DACs is a composite result of the digital inputs. Weigand minimizes the error in the conversion of the digital-to-analog signals by decreasing the effect of the transition of the more significant bits in the converter apparatus. Weigand does not, however, disclose the overall accuracy and data rate of the converter being greater than one of its constituent components.

As can be seen from the above references, the prior art discusses many schemes of breaking digital input words into blocks and operating on those blocks separately. It does not disclose a scheme in which input digital words of very large ranges can be operated on with a high data rate and with high accuracy.

SUMMARY OF THE INVENTION

The deficiencies of the prior art show that a need exists to have a large range, digital-to-analog conversion system which operates with a high degree of accuracy and a high data rate. It is, therefore, an object of the present invention to provide a DAC system which can convert a large-range digital word with high speed.

It is a further object of the invention to provide a DAC system which can convert a large-range digital word with high accuracy.

It is yet a further object of the invention to provide a method for converting a large-range digital word to an analog output at a high data rate and high accuracy.

It is still another object of the invention to provide a tool correction apparatus which can convert a large range digital word corresponding to the desired tool correction into the analog output necessary to implement this correction with high accuracy and high speed.

In accordance with these and other objects of the present invention, a digital-to-analog converter (DAC) system is provided which includes a logic system which generates a digital word composed of most significant bits and least significant bits. The system has a first DAC for receiving the most significant bits and providing a first analog output which has a first data rate and a first range. The system also contains a second DAC for receiving the least significant bits and providing a second analog output. The second DAC has a second data rate and second range, with the second data rate being faster than the data rate of the first DAC. Means for combining the first and second analog outputs are provided to produce a single analog signal representative of the digital word. The data rate of the combined output may be as fast as the data rate of the second DAC and the range of the combined output may be as large as the first range.

System accuracy may be increased by providing a circuit which holds the switching of the first DAC until the first DAC glitches are settled to within a predetermined value. Glitches due to simultaneous switching of the first and second DAC are avoided by additional circuitry which holds the switching of the first and second DACs as necessary to avoid this simultaneous switching.

The invention also provides a method for converting large-range digital words to analog signals with high speed and a high degree of accuracy. This method includes generating a digital word composed of most significant bits and least significant bits. The most significant bits are then converted into a first analog output in a DAC having a first data rate and first range. The least significant bits are converted into a second analog output in a second DAC having a second data rate and second range. These analog outputs are then combined to produce an analog signal representative of the digital word. The data rate of the combined output may be as fast as the second data rate and the range of the combined output may be as large as the first range.

In a more particular embodiment, the invention provides a tool correction system which first includes means for determining the position of a tool. A logic system then compares the position of the tool with a predetermined position and generates a digital word composed of most significant bits and least significant bits which corresponds to the difference between the tool position and the predetermined position. The system then includes first and second DACs. The first DAC has a first data rate, a first range, and provides significant bits. The second DAC has a second data rate, and a second range, the second data rate being faster than the first data rate, and receives the least significant bits and converts them into a second analog output. The system then has circuitry for combining the two analog outputs to produce an analog signal. The data rate of the analog signal may be as fast as the data rate of the second DAC and the range of the analog signal may be as large as the first range. The system lastly includes a means for applying a correction signal corresponding to the analog signal to the tool.

The foregoing and other objects, features, and advantages of the invention will be apparent from the following, more particular description of a preferred embodiment of the invention as illustrated in the accompanying drawings.

BRIEF DESCRIPTION OF THE DRAWINGS

In the accompanying drawings forming a material part of this disclosure.

DETAILED DESCRIPTION OF THE INVENTION

Figure 1:
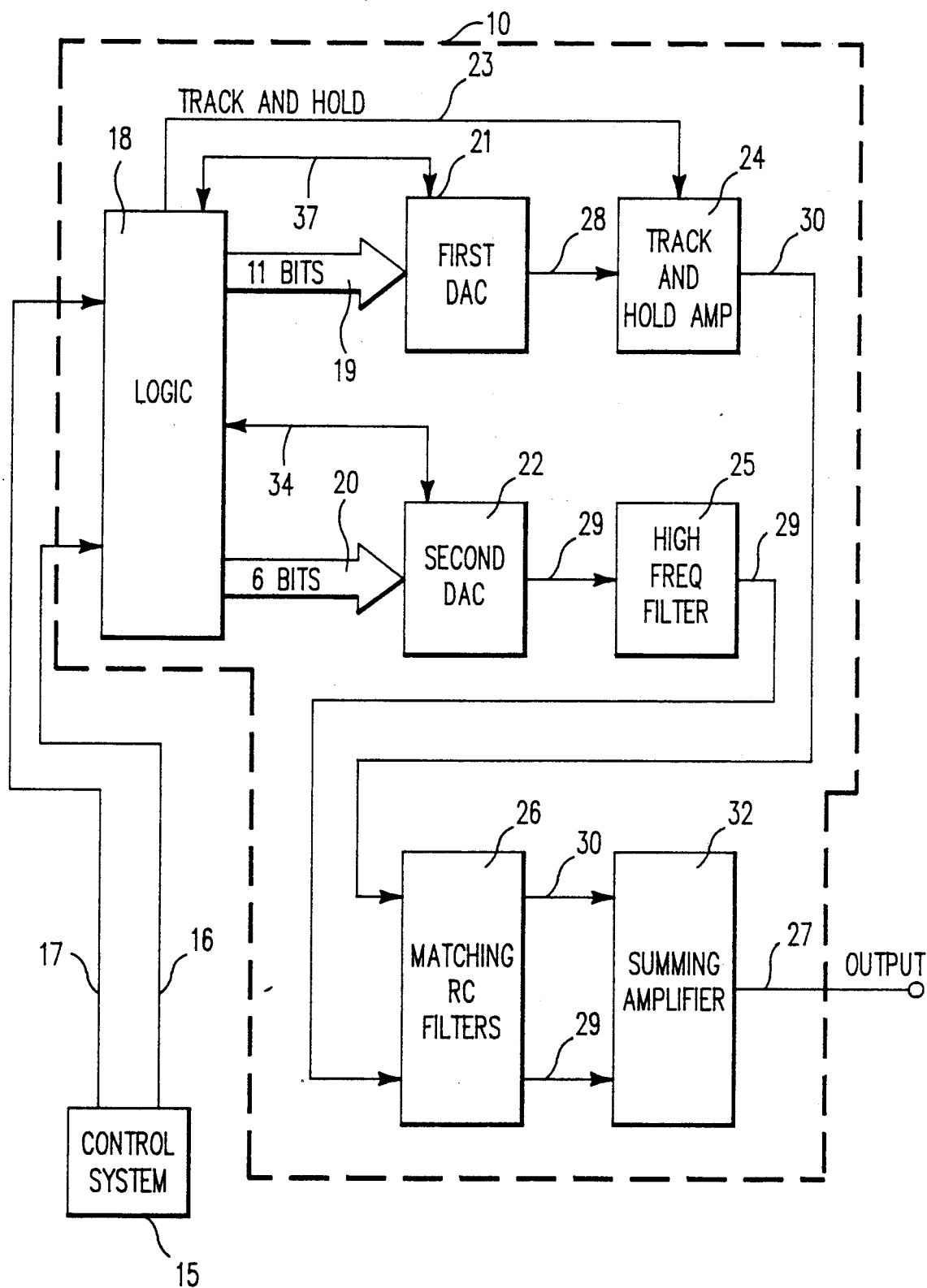
FIG. 1 is a schematic block diagram of the system comprising the present invention.

Referring to the drawings in more detail, and particularly referring to FIG. 1 of the invention, there is shown the DAC system 10 according to the present invention. The DAC system 10 includes a logic system 18, which provides a digital word composed of most significant bits and least significant bits in response to signals from the control system 15 over the increment/decrement line 16. The control system 15 also provides a clock signal on line 17 to the logic system 18. The control system 15, may be used to control the electron beam machining of an electronic substrate or the electron beam exposure of wafers and masks for patterning, for example. Internal to the logic system 18 may be a counter for counting digital signals, higher order circuitry for generating a first set of signals representing the more significant bits of a count in the counter and lower order circuitry for generating a second set of signals representing the less significant bits of the count in the counter.

In the embodiment shown in FIG. 1, the digital word is a 15-bit word which may have a value up to $2^{15}$ or 32,768. In this example, the most significant bits are the upper 11 bits on bus 19 of the digital word and the least significant are the lower 6 bits on bus 20 of the digital word, thus providing a 2-bit overlap between the most significant bits and least significant bits. This example is a preferred embodiment of the invention but the range of the digital word is limited only by the ranges of available DACs.

From logic system 18, bus 19 connects to a first DAC 21, which has a first data rate and a first range. The first DAC 21 receives the most significant bits 19 and provides a first analog output 28. The first DAC has a first accuracy with respect with the range of the first DAC. DACs such as the first DAC 21 usually have large glitches on the order of hundreds of least significant bits, as well as low data rates, 200 Khz or less. In a preferred embodiment of the present invention the first DAC 21 is a DAC711, manufactured by Burr-Brown Corporation. The DAC711 is a 16 bit DAC which has 15 bits of true accuracy and a settling time of 4.0 $\mu$sec, during which time glitches settle out.

System 18 is also connected by bus 20 to a second DAC 22 having a second data rate and a second range. The second DAC 22 receives the least significant bits 20 and provides a second analog output 29. Of great significance to the present invention is that the data rate of the second DAC 22 is higher than that of the first DAC 21. Commercially available DACs having a low range, such as the second DAC 22, typically have a much higher speed than DACs which have a larger range. The second DAC 22 also has a second accuracy. Although the second DAC 22 may have an absolute accuracy which is greater than that of the first DAC 21, its accuracy may be less with respect to its range than that of the first DAC 21. In a preferred embodiment of the present invention, the second DAC 22 is a 12 bit DAC63, manufactured by Burr-Brown Corporation.

The analog outputs 28, 29 are then connected to track and hold amplifier 24, high frequency filter 25, and matching RC filters 26. The functions of these components will be more fully explained hereinafter.

Means are provided for combining the first and second analog outputs 28, 29 to produce an analog signal representative of the digital word representing the overall count received from the logic system. In the embodiment shown in FIG. 1, this combining means is the summing amplifier 32. The maximum speed of the combined output 27 from amplifier 32 may be as fast as the data rate of the second DAC 22 and in this embodiment is 2 Mhz. The speed is based on the maximum anticipated bit rate of the increment/decrement signal 16 and is not the limitation of the Burr-Brown DAC63. The range of the combined output 27 may be as large as the range of the first DAC 21. The least significant bits and most significant bits may overlap by at least one bit and as previously described, there is a two-bit overlap in the embodiment shown in FIG. 1. In the case where the most significant bits and the least significant bits overlap, the combining means may include means to compensate for the overlap of the first and second ranges, such as appropriately valued resistor dividers in the summing amplifier 32.

Figure 2:
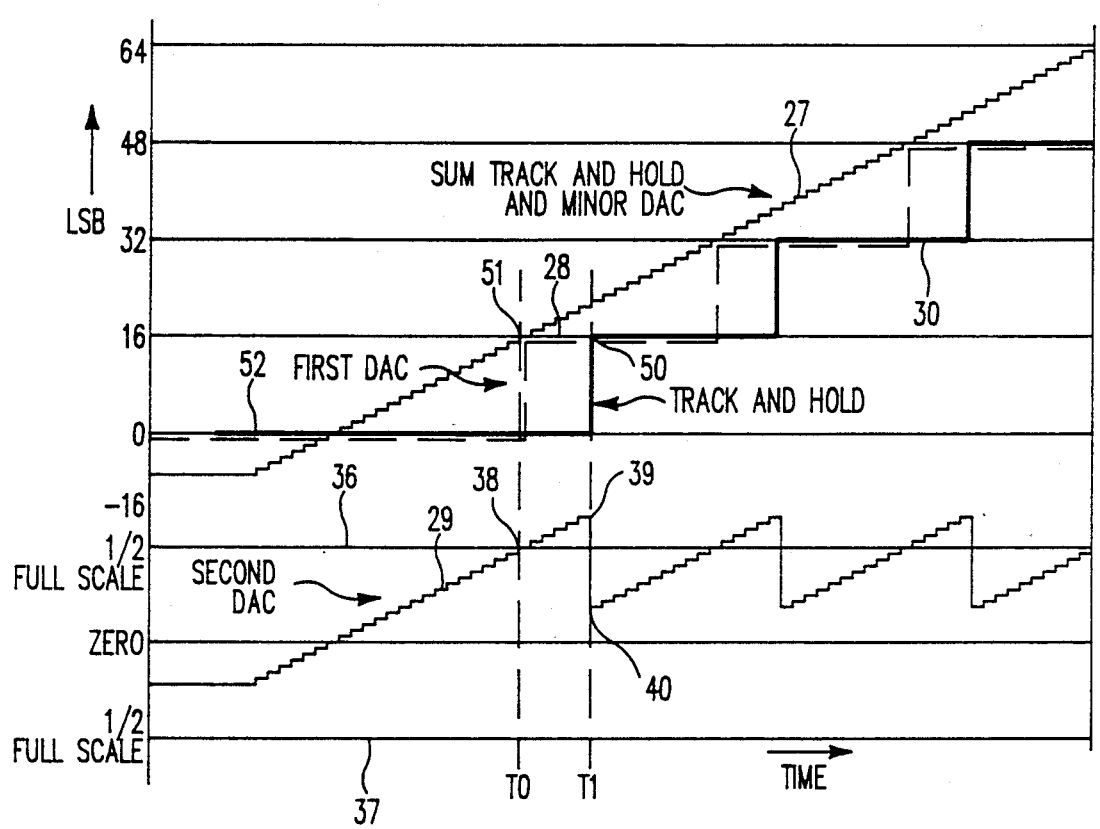
FIG. 2 shows the wave forms of the first DAC, the second DAC, a track and hold amplifier, and the total output of the system.

Referring now to FIG. 2, an example representing the DAC wave forms is shown. The output 29 of the second DAC 22 is a staircase, reflecting one-bit increments. Since there is a two bit overlap between the most significant bits and the least significant bits in the embodiment illustrated in FIGS. 1 and 2, there are $2^4=16$ least significant bit increments for each most significant bit increment and not $2^6=64$, which is the actual width of the least significant bits bus 20. The figure shows the output 29 incrementally increasing, but this is, of course, only for purposes of illustration. The direction of the increments will depend on the increment/decrement signal 16. The figure also shows the increments with a constant time period, which is also only for purposes of illustration. The bit rate of these increments and thus the system speed will vary depending on the output of the computer or sensor which generates the digital word, this variation being reflected in the increment/decrement signal 16. In a preferred embodiment of the invention, this bit rate can be as fast as 500 nsec/bit, corresponding to a system speed of 2 Mhz.

When the second DAC output 29 value reaches one-half of the full scale 36 of the second DAC 22, at time T0, the output 28 of the first DAC is incremented, the increment corresponding to 16 least significant bits, but not yet summed with the second DAC output 29 to constitute the total output 27. In order to avoid the first DAC 21 switching glitches during its settling time, which as previously described can be hundreds of least significant bits, the logic system includes first means to hold the switching of the first DAC 21 until these glitches are settled to within a predetermined value. Referring again to FIG. 1, the logic system 18 sends a track and hold signal 23 to the track and hold amplifier 24, which is included in this first switching holding means.

The total output on line 27 of the system is the sum of the second DAC output 29 and the track and hold amplifier 24 output on line 30. As can be seen from FIG. 2, the track and hold signal 30 tracks the first DAC output 28, prior to the switching of the first DAC at T0 in response to a signal from logic 18 over line 37. The track and hold amplifier then holds at the pre-switching level 52 of the first DAC 21 from time T0 to time T1. A hold to track transition 50 then occurs at T1 in response to a signal 23 from the logic system 18 and the track and hold amplifier tracks the post-switching level 51 of the first DAC 21. When the first DAC 21 and thus the track and hold amplifier 24 are incremented, the increment corresponding to 16 least significant bits, the second DAC 22 is decremented in response to a signal from logic 18 over line 34 to be within the plus 36 or minus 37 one-half full scale range.

In the illustrated embodiment, summation of the first DAC output 28 and second DAC output 29 is held up for 6½-8½ μsec after T0, depending on the data rate, so that the first DAC 21 glitches due to digital switching are settled to within one least significant bit. The reason for this variable range will be more fully explained hereinafter. The second DAC 22 is still incrementing during this period. The second DAC 22 will not overflow or underflow, depending on whether the second DAC is incrementing or decrementing, before the hold to track transition. In the embodiment shown in FIG. 2, the second DAC increments to its greatest extent 39 at time T1, at which time the first DAC 21 glitches have settled so that the track and hold enable signal 23 can switch from hold to track 50. The second DAC 22 is then switched down 16 least significant bits 40, so that the second DAC 22 is kept within the normal range of plus 36 or minus 37 half full scale.

To eliminate glitches when both DACs are switching, the logic system further includes second means to hold switching of the first and second DACs so that the first and second DACs do not increment/decrement simultaneously. The track and hold enable signal 23 on line is carefully delayed to match the switching of the second DAC 22. If the increment bit rate is slower than a predetermined value, 2 μsec/bit in the illustrated embodiment, a time window of a predetermined period is set to begin a predetermined time after T0, a 1 μsec window 6 μsec after T0 in the illustrated embodiment. If an increment or decrement of the second DAC 22 should come within this window, the increment or decrement signal is delayed by a signal from logic 18 over line 34 until 500 ns after the hold to track transition at 6.5 μs so that no simultaneous switching occurs. If the increment bit rate is faster than the predetermined value, the hold to track transition will be delayed to occur after the next bit change. This will ensure that there will not be more than one bit transition within a predetermined period. In the illustrated embodiment of the present invention, this delaying of the first and second DAC switchings to prevent noise cause the summing of the outputs to be delayed for 6.5-8.5 μsec, the exact time depending on the data rate and arrival time of the increment signals. The second DAC transition 39 to 40 in FIG. 2 will always occur before the second DAC output 29 exceeds plus or minus the full range of the second DAC 22. Thus, the first switching holding occurs when the second DAC output exceeds plus or minus half the second DAC range and both the first and second switching holdings terminate before the second DAC output exceeds plus or minus the second DAC range.

To further ensure that the switching glitches are small, the system further comprises first high frequency filter means 25 to filter the second analog output 29 prior to the combining means. In the preferred embodiment, the second DAC output 29 is filtered by the high frequency inductor-resistor filter 25 to eliminate spikes.

Further filtering may then be performed by second means 26 to filter each of the first and second analog outputs prior to the combining means, the second filter means including filter elements having the same time constant. In the preferred embodiment, the track and hold amplifier output 30 and the high frequency filtered output 29 of the second DAC 22 are filtered by lower frequency matching RC filters 26, which are resistor capacitor filters having the same time constant and thus tuned to match each other. The filtered outputs 30, 29 are then summed in the summing amplifier 32.

The resulting summed voltage 27 contains fluctuations of less than one least significant bit. In this preferred embodiment, the overall output thus achieves an accuracy of one least significant bit over a range of $2^{15}$ with a maximum data rate of 2 Mhz.

As hereinbefore described, the maximum system data rate is selected based upon the output of the computer or sensor which generates the digital word. In the illustrated embodiment of the present invention, this rate is 2 Mhz or 500 nsec/bit. The described switching holding means assure that the second DAC 22 does not overflow the full positive extent of its 6 bit range during the interval from T0 to T1.

If a different application requires a higher data rate, different apportionment of bits between the first DAC 21 and second DAC 22 can be used. For example, if bus 19 is designed to be 9 bits wide and bus 20 is designed to be 8 bits wide, with a 2 bit overlap between buses as in the present embodiment, a data rate of 125 nsec/bit or 8 Mhz is achievable without overflow of the second DAC in the interval from T0 to T1. Depending on the application requirements, proper selection of the bus 20 width will allow the system operating speed to be as large as the data rate of the second DAC 22. If a more advanced first DAC is used, such as the 18 bit Burr-Brown 729, which has 17 bits of true accuracy, a composite 17 bit high speed, high accuracy DAC is achievable. It should be clear that the present invention encompasses similar accuracies with higher ranges and data rates as better components become available.

The above description demonstrates that the system of the present invention provides a method for converting digital words to analog signals with high speed, a large range, and a high degree of accuracy. This method first comprises the step of generating a digital word composed of most significant bits and least significant bits. The next step comprises converting the most significant bits into a first analog output with a first DAC having a first data rate and a first range and converting the least significant bits into a second analog output with a second DAC having a second data rate and a second range. The method then comprises combining the first and second analog outputs to produce an analog signal representative of the digital word, wherein the data rate of the combined output may be as fast as the second data rate and the range of the combined output may be as large as the first range.

The conversion method may further comprise first holding switching of the first DAC until glitches are settled to within a predetermined value and second holding switching of the first and second DACs so that the first and second DACs do not switch simultaneously. In order to optimize use of the second DAC range and yet prevent overflow of the second DAC, the first switching holding will occur when the second DAC output exceeds plus or minus half the second DAC range and both the first and second switching holdings will terminate before the second DAC output exceeds plus or minus the second DAC range.

Accuracy of the conversion method is enhanced by first filtering the second analog output prior to combining the analog outputs and by second filtering each of the first and second analog outputs prior to combining the analog outputs, the second filtering having the same time constant for each of the analog outputs.

Figure 3:
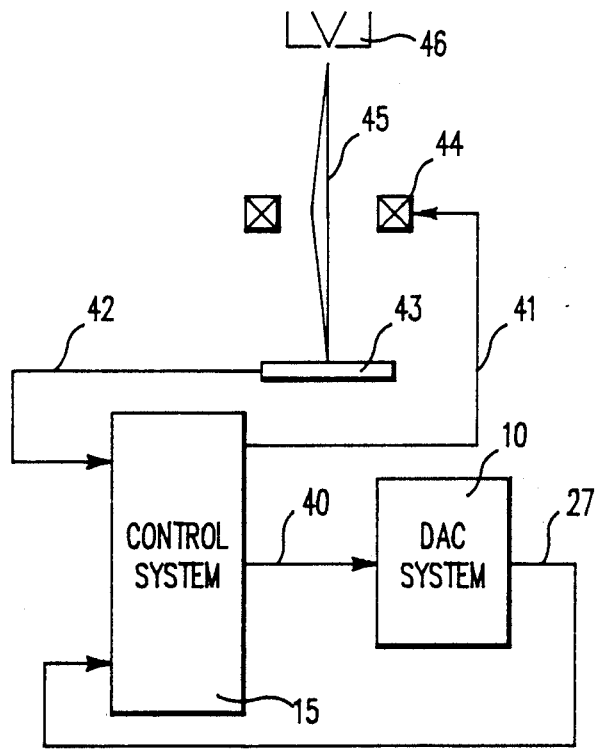
FIG. 3 shows a block diagram in which the DAC system is used for tool correction in correcting the deflection in an electron beam exposure system.

Referring to FIG. 3, there is illustrated a tool correction system which is another embodiment of the present invention. In a preferred embodiment, the tool correction system is a system for ensuring accurate positioning of an electron beam on an electronic substrate for exposure of wafers and masks. An electron beam generator 46 generates an electron beam 45 which is deflected by deflection coils 44 before striking a substrate 43.

The tool correction system comprises a means for determining position of a tool, such as a laser interferometer, which generates a signal on line 42 as an input to the control system 15. The system comprises a logic system, a portion of which may be located in the control system 15, which includes means for comparing the measured tool position with a predetermined position. The tool correction system also includes the previously described DAC system 10 of the present invention. The logic system of the tool correction system also generates a digital word composed of most significant bits and least significant bits in the DAC system 10, the digital word position and the predetermined position. This DAC system includes all previously described elements such as the first DAC, the second DAC, switching holding means, etc. The combined output on line 27 of the DAC system comprises a correction signal which is input to the control system 15. The correction system lastly comprises means for applying the correction signal corresponding to the combined analog output of the DAC system to the tool. This means may include circuitry in the control system 15 which generates a signal on line 41 which will cause the deflection coil 44 to deflect the electron beam 45 an amount necessary to achieve desired correction.

There are several delays inherent in the tool correction system including delays in the position determining means, delays in the filtering means of the DAC system, and delays in applying the analog correction signal to the tool. These delays may cause an error when the workpiece holder, such as the stage of any electron beam exposing apparatus, is being moved at high speed. This error may be corrected by applying a correction current proportional to the workpiece holder speed, as obtained from the output of devices driving the workpiece holder, to the deflection coil 44.

The described tool correction system provides a method for correcting the position of tool which comprises determining the position of the tool and comparing the tool position with a predetermined position. The method then comprises generating a digital word composed of most significant bits and least significant bits, the digital word corresponding to the difference between the tool position and the predetermined position.

The next steps include converting the most significant bits into a first analog output with a first DAC having a first data rate and a first range and converting the least significant bits into a second analog output with a second DAC having a second data rate and a second range. The method then comprises combining the first and second analog outputs to produce an analog signal representative of the digital word, wherein the data rate of the combined output may be as fast as the second data rate and the range of the combined output may be as large as the first range. The method finally comprises applying a correction signal corresponding to the combined analog signal to the tool.

Accuracy of this method is enhanced by the additional step of first holding switching the first DAC until glitches are settled to within a predetermined value and second holding switching of the first and second DACs so that the first and second DACs do not switch simultaneously. Overflow of the second DAC is prevented and use of the second DAC range optimized in this method by the first switching holding occurring when the second DAC output exceeds plus or minus half the second DAC range and both the first and second switching terminating before the second DAC output exceeds plus or minus the second DAC range.

While the invention has been illustrated and described with reference to the preferred embodiments thereof, it is to be understood that the invention is not limited to the precise construction herein disclosed and the right is reserved to all changes and modifications coming within the scope of the invention as defined in the appended claims.

What is claimed is:

1. A digital-to-analog converter (DAC) system comprising:
   a logic system providing a digital word composed of most significant bits and least significant bits;
   a first DAC having a first data rate and a first range for receiving the most significant bits and providing a first analog output;
   a second DAC having a second data rate and a second range for receiving the least significant bits and providing a second analog output, wherein the second data rate is faster than the first data rate; and
   means for combining the first and second analog outputs to produce an analog signal representative of the digital word, wherein the data rate of the combined output may be as fast as the second data rate and the range of the combined output may be as large as the first range.

2. The DAC system of claim 1 wherein the logic system includes first means to hold switching of the first DAC until glitches are settled to within a predetermined value.

3. The DAC system of claim 2 wherein the logic system further includes second means to hold switching of the first and second DACs so that the first and second DACs do not switch simultaneously.

4. The DAC system of claim 3 wherein the first and second switching hold means include a track and hold amplifier.

5. The DAC system of claim 1, wherein the first DAC has a first accuracy with respect to the first range and the second DAC has a second accuracy with respect to the second range, the second accuracy being less than the first accuracy.

6. The DAC system of claim 3 wherein the first switching holding occurs when the second DAC output exceeds plus or minus half the second range and both the first and second switching holding terminate before the second DAC output exceeds plus or minus the second range.

7. The system of claim 3 further comprising first means to filter the second analog output prior to the combining means.

8. The system of claim 7 further comprising second means to filter each of the first and second analog outputs prior to the combining means, the second filter means including filter elements having the same time constant.

9. A digital-to-analog converter (DAC) system comprising:
   a logic system providing a digital word composed of most significant bits and least significant bits;
   a first DAC having a first data rate for receiving the most significant bits and providing a first analog output;
   a second DAC having a second data rate for receiving the least significant bits and providing a second analog output, wherein the second data rate is faster than the first data rate; and
   means for combining the first and second analog outputs to produce an analog signal representative of the digital word, wherein the data rate of the combined output may be as fast as the second data rate;
   wherein the logic system includes first means to hold switching of the first DAC until glitches are settled to within a predetermined value.

10. The DAC system of claim 9 wherein the logic system further includes second means to hold switching of the first and second DACs so that the first and second DACs do not switch simultaneously.

11. The system of claim 10 wherein the most significant bits and the least significant bits overlap by at least one bit.

12. The system of claim 11 wherein the combining means includes means to compensate for the overlap of the most significant bits and the least significant bits.

13. The DAC system of claim 10 wherein the first DAC has a first range and the second DAC has a second range, wherein the range of the combined output may be as large as the first range.

14. The DAC system of claim 10 wherein the first and second switching hold means includes a track and hold amplifier.

15. The DAC system of claim 13, wherein the first DAC has a first accuracy with respect to the first range and the second DAC has a second accuracy with respect to the second range, the second accuracy being less than the first accuracy.

16. The DAC system of claim 10 wherein the first switching holding occurs when the second DAC output exceeds plus or minus half the second range and both the first and second switching holding terminate before the second DAC output exceeds plus or minus the second range.

17. The system of claim 10 further comprising first means to filter the second analog output prior to the combining means.

18. The system of claim 17 further comprising second means to filter each of the first and second analog outputs prior to the combining means, the second filter means including filter elements having the same time constant.

19. A tool correction system comprising:
   means for determining a position of a tool;
   a logic system including means for comparing the tool position with a predetermined position and generating a digital word composed of most significant bits and least significant bits, the digital word corresponding to the difference between the tool position and the predetermined position;
   a first DAC having a first data rate and a first range for receiving the most significant bits and providing a first analog output;
   a second DAC having a second data rate and a second range for receiving the least significant bits and providing a second analog output, wherein the second data rate is faster than the first data rate;

means for combining the first and second analog outputs to produce an analog signal representative of the digital word, wherein the data rate of the combined output may be as fast as the second data rate and the range of the combined output may be up as large as the first range; and means for applying a correction signal corresponding to the analog signal to the tool.

20. The tool correction system of claim 19 wherein the logic system includes first means to hold switching of the first DAC until glitches are settled to within a predetermined value.

21. The tool correction system of claim 20 wherein the logic system further includes second means to hold switching of the first and second DACs so that the first and second DACs do not switch simultaneously.

22. The tool correction system of claim 21 wherein the first switching holding occurs when the second DAC output exceeds plus or minus half the second range and both the first and second switching holding terminate before the second DAC output exceeds plus or minus the second range.

23. A digital-to-analog converter (DAC) system comprising:

a logic system including a counter for counting digital signals, high order means for generating a first set of signals representing most significant bits of a count in the counter, and lower order means for generating a second set of signals representing least significant bits of the count in the counter;

a first DAC having a first data rate and first range, with a first accuracy with respect to the first range, for receiving the first set of signals representing the most significant bits from the logic system;

a second DAC having a second data rate and a second range, with a second accuracy with respect to the second range, for receiving the second set of signals representing the least significant bits from the logic system, wherein the second data rate is higher than the first data rate and the second accuracy is less than the first accuracy; and means for combining the analog outputs of the first and second DACs into a combined output signal in the form of an analog signal, the analog signal representative of the overall count received from the logic system.

24. The DAC system of claim 23 wherein the logic system includes first means to hold switching of the first DAC until glitches are settled to within a predetermined value.

25. The DAC system of claim 24 wherein the logic system further includes second means to hold switching of the first and second DACs so that the first and second DACs do not switch simultaneously.

26. The DAC system of claim 25 wherein the first switching holding occurs when the second DAC output exceeds plus or minus half the second range and both the first and second switching holding terminate before the second DAC output exceeds plus or minus the second range.

27. The system of claim 23 wherein the most significant bits and the least significant bits overlap by at least one bit.

28. The system of claim 27 wherein the combining means includes means to compensate for the overlap of the most significant bits and the least significant bits.

29. A method for converting digital words to analog signals with high speed, a large range, and a high degree of accuracy, comprising the steps of:

generating a digital word composed of most significant bits and least significant bits;

converting the most significant bits into a first analog output with a first digital-to-analog converter (DAC) having a first data rate and a first range;

converting the least significant bits into a second analog output with a second digital-to-analog converter (DAC) having a second data rate and a second range; and combining the first and second analog outputs to produce an analog signal representative of the digital word, wherein the data rate of the combined output may be as fast as the second data rate and the range of the combined output may be as large as the first range.

30. The method of claim 29 further comprising first holding switching of the first DAC until glitches are settled to within a predetermined value.

31. The method of claim 30 further comprising second holding switching of the first and second DACs so that the first and second DACs do not switch simultaneously.

32. The method of claim 31 wherein the first switching holding occurs when the second DAC output exceeds plus or minus half the second range and both the first and second switching holding terminate before the second DAC output exceeds plus or minus the second range.

33. The system of claim 29 further comprising first filtering the second analog output prior to combining the first and second analog outputs.

34. The system of claim 33 further comprising second filtering each of the first and second analog outputs prior to combining the analog outputs, the second filtering having the same time constant for each of the analog outputs.

35. A method for correcting the position of a tool, comprising the steps of:

determining a position of the tool;

comparing the tool position with a predetermined position;

generating a digital word composed of most significant bits and least significant bits, the digital word corresponding to the difference between the tool position and the predetermined position;

converting the most significant bits into a first analog output with a first digital-to-analog converter (DAC) having a first data rate and a first range;

converting the least significant bits into a second analog output with a second digital-to-analog converter (DAC) having a second data rate and a second range;

combining the first and second analog outputs to produce an analog signal representative of the digital word, wherein the data rate of the combined output may be as fast as the second data rate and the range of the combined output may be as large as the first range; and applying a correction signal corresponding to the analog signal to the tool.

36. The tool correction method of claim 35 further comprising first holding switching of the first DAC until glitches are settled to within a predetermined value.

37. The tool correction method of claim 36 further comprising second holding switching of the first and second DACs so that the first and second DACs do not switch simultaneously.

38. The tool correction method of claim 37 wherein the first switching holding occurs when the second DAC output exceeds plus or minus half the second range and both the first and second switching holding terminate before the second DAC output exceeds plus or minus the second range.

* * * * *